United States Patent
Ivanov

(10) Patent No.: US 9,641,935 B1
(45) Date of Patent: May 2, 2017

(54) METHODS AND APPARATUSES FOR PERFORMING ADAPTIVE EQUALIZATION OF MICROPHONE ARRAYS

(71) Applicant: Motorola Mobility LLC, Chicago, IL (US)

(72) Inventor: Plamen A Ivanov, Schaumburg, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 14/963,913

(22) Filed: Dec. 9, 2015

(51) Int. Cl.
H04R 3/00 (2006.01)
H03G 5/16 (2006.01)

(52) U.S. Cl.
CPC ............. H04R 3/005 (2013.01); H03G 5/165 (2013.01)

(58) Field of Classification Search
CPC ................................ H04R 3/005; H03G 5/165
USPC .......................................................... 381/92
See application file for complete search history.

(56) References Cited

U.S. PATENT DOCUMENTS

| | | | |
|---|---|---|---|
| 8,116,508 B2 | 2/2012 | Xu et al. | |
| 8,213,659 B2 | 7/2012 | Mottonen et al. | |
| 8,879,771 B2 | 11/2014 | Mellow et al. | |
| 9,124,977 B2 | 9/2015 | Ozcan | |
| 9,143,875 B2 | 9/2015 | Ozcan | |
| 2007/0055505 A1* | 3/2007 | Doclo ................. | G10L 21/0208 704/226 |
| 2007/0183537 A1* | 8/2007 | Matsumoto ......... | H04L 25/0224 375/340 |
| 2010/0080409 A1 | 4/2010 | Xu et al. | |
| 2010/0329496 A1 | 12/2010 | Mottonen et al. | |
| 2011/0164141 A1 | 7/2011 | Tico et al. | |
| 2011/0248935 A1 | 10/2011 | Mellow et al. | |
| 2011/0268292 A1 | 11/2011 | Suvanto et al. | |
| 2012/0099829 A1 | 4/2012 | Moberg et al. | |
| 2012/0257776 A1 | 10/2012 | Ozcan | |
| 2012/0294450 A1 | 11/2012 | Ozcan | |
| 2013/0077810 A1 | 3/2013 | Mellow et al. | |
| 2013/0144615 A1 | 6/2013 | Rauhala et al. | |
| 2013/0223631 A1 | 8/2013 | Greuet et al. | |
| 2013/0226593 A1 | 8/2013 | Magnusson et al. | |

(Continued)

OTHER PUBLICATIONS

Heinz Teutsch and Gary W. Elko, "An Adaptive Close-Talking Microphone Array", IEEE Workshop on Applications of Signal Proessing to Audio and Acoustics 2001, Oct. 21-24, 2001, pp. 163-166, New Paltz, New York.

*Primary Examiner* — Paul S Kim
*Assistant Examiner* — Katherine Faley
(74) *Attorney, Agent, or Firm* — Cygan Law Offices P.C.

(57) ABSTRACT

Configuring an adaptive microphone array to gather signals from a main lobe of the array, and configuring the array to reduce side interference gathered from sources that are not situated within the main lobe. A memory stores test signals gathered by the array in an anechoic chamber, a free-field environment, or other echo, interference and noise-minimized acoustic environment. Signals gathered in real time are processed to provide a preliminary output and preliminary weights. The test signals are retrieved from memory. The preliminary weights are applied to the test signals to provide equalizer weights. The equalizer weights and the preliminary output generate an equalized output that minimizes degradations resulting from side interference reduction.

20 Claims, 12 Drawing Sheets

(56) References Cited

U.S. PATENT DOCUMENTS

| | | |
|---|---|---|
| 2013/0272557 A1 | 10/2013 | Ozcan et al. |
| 2014/0189510 A1 | 7/2014 | Ozcan |
| 2014/0193019 A1 | 7/2014 | Yan et al. |
| 2014/0254817 A1 | 9/2014 | Vilermo et al. |
| 2014/0375310 A1 | 12/2014 | Greuet et al. |
| 2015/0030159 A1 | 1/2015 | Ozcan |
| 2015/0049899 A1 | 2/2015 | Mellow et al. |
| 2015/0071449 A1 | 3/2015 | Ozcan |
| 2015/0304776 A1 | 10/2015 | Backman et al. |

\* cited by examiner

METHODS AND APPARATUSES FOR PERFORMING ADAPTIVE EQUALIZATION OF MICROPHONE ARRAYS

FIELD OF THE DISCLOSURE

The present disclosure relates to audio processing and, more particularly, to methods and apparatuses for performing adaptive equalization of microphone arrays.

BACKGROUND OF THE DISCLOSURE

A microphone array is a group of two or more microphones arranged in a specific geometric configuration and used to gather and process acoustic signals. One advantage of using a microphone array over a single microphone lies in the fact that the array adds dimensional information to the signal acquisition process. Accordingly, beam forming techniques may be used to provide a main lobe for receiving signals of interest that arrive from one or more desired directions. Beam forming increases the gain of the microphone array in one or more desired directions, while decreasing the gain in other directions to thereby improve the signal-to-noise ratio of a desired signal. Beam forming techniques may also be used to reduce or nearly eliminate (null out) signals from sources in a specific direction.

Adaptive microphone arrays may be configured to reduce side interference from sources of acoustic energy that are not situated in the main lobe of the array. Temporal and spatial information included in the signals collected by the microphone array are estimated using array signal processing and adaptation procedures to formulate a filter transfer function for the array. However, these arrays have the undesirable property of degrading signals of interest in the main lobe of the array. This degradation is caused by speech leakage affecting the adaptation procedure executed by the array, as well as artifacts caused by the calculated transfer function for a specific source and array configuration, modeled by the adaptive filter.

BRIEF SUMMARY OF THE INVENTION

In at least some embodiments, the present invention relates to a method that includes configuring an adaptive microphone array to gather signals from one or more desired directions in a main lobe of the array, and configuring the array to reduce side interference gathered from one or more sources of acoustic energy that are not situated within the main lobe of the array. The method further includes configuring a computer-readable memory to store one or more test signals gathered by the array in an anechoic chamber, free-field environment, or other echo, interference and noise-minimized acoustic environment, processing one or more signals gathered in real time to provide a preliminary output signal and a set of preliminary weights, retrieving the one or more test signals from the computer-readable memory, modeling a degradation in the gathered signals from the adaptive microphone array by applying the set of preliminary weights to the one or more test signals to provide a set of equalizer weights; and minimizing or reducing the modeled degradation in the gathered signals by processing the set of equalizer weights and the preliminary output signal to generate an equalized output signal.

In at least some embodiments, the present invention relates to an apparatus that includes an adaptive microphone array configured to gather signals from one or more desired directions in a main lobe of the array, and configured to reduce side interference gathered from one or more sources of acoustic energy that are not situated within the main lobe of the array. A computer-readable memory, operatively coupled to the array, is configured to store one or more test signals gathered by the array in an anechoic chamber, free-field environment, or other echo, interference and noise-minimized acoustic environment. The array further comprises a processing mechanism for processing one or more signals gathered by the array in real time to provide a preliminary output signal and a set of preliminary weights, retrieving the one or more test signals from the computer-readable memory, modeling a degradation in the gathered signals from the adaptive microphone array by applying the set of preliminary weights to the one or more test signals to provide a set of equalizer weights, and minimizing or reducing the modeled degradation in the gathered signals by processing the set of equalizer weights and the preliminary output signal to generate an equalized output signal.

Moreover, in at least some embodiments, the present invention relates to a non-transitory computer-readable memory encoded with a computer program comprising computer readable instructions recorded thereon for execution of a method that includes configuring an adaptive microphone array to gather signals from one or more desired directions in a main lobe of the array, and configuring the array to reduce side interference gathered from one or more sources of acoustic energy that are not situated within the main lobe of the array. The method further includes configuring a computer-readable memory to store one or more test signals gathered by the array in an anechoic chamber, free-field environment, or other echo, interference and noise-minimized acoustic environment, processing one or more signals gathered in real time to provide a preliminary output signal and a set of preliminary weights, retrieving the one or more test signals from the computer-readable memory, modeling a degradation in the gathered signals from the adaptive microphone array by applying the set of preliminary weights to the one or more test signals to provide a set of equalizer weights, and minimizing or reducing the modeled degradation in the gathered signals by processing the set of equalizer weights and the preliminary output signal to generate an equalized output signal.

DETAILED DESCRIPTION

According to a set of exemplary embodiments, an adaptive microphone array is configured for gathering signals from one or more desired directions in a main lobe of the array. This functionality is achieved by adjusting the relative amplitudes and phases of the signals produced by each of a plurality of individual microphones in the array, and then combining the adjusted signals into a single composite output signal. The adaptive microphone array is further configured for reducing side interference from one or more sources of acoustic energy that are not situated in the main lobe. Side interference is reduced by utilizing a first circuit that will orient a null along the one or more desired directions towards a desired source, as well as a second circuit oriented with its maximum sensitivity towards the one or more desired directions. Using an adaptive filtering mechanism, a first signal produced by the first circuit and containing little or no signal from the desired source is filtered and subtracted out of a second signal produced by the second circuit and including the desired source. In most practical systems, it is extremely unlikely that the first signal would only include only side interference signals and no signal components from the desired source. Accordingly, the foregoing filtering and summing operation may adversely impact signals received from the desired source.

Figure 1:
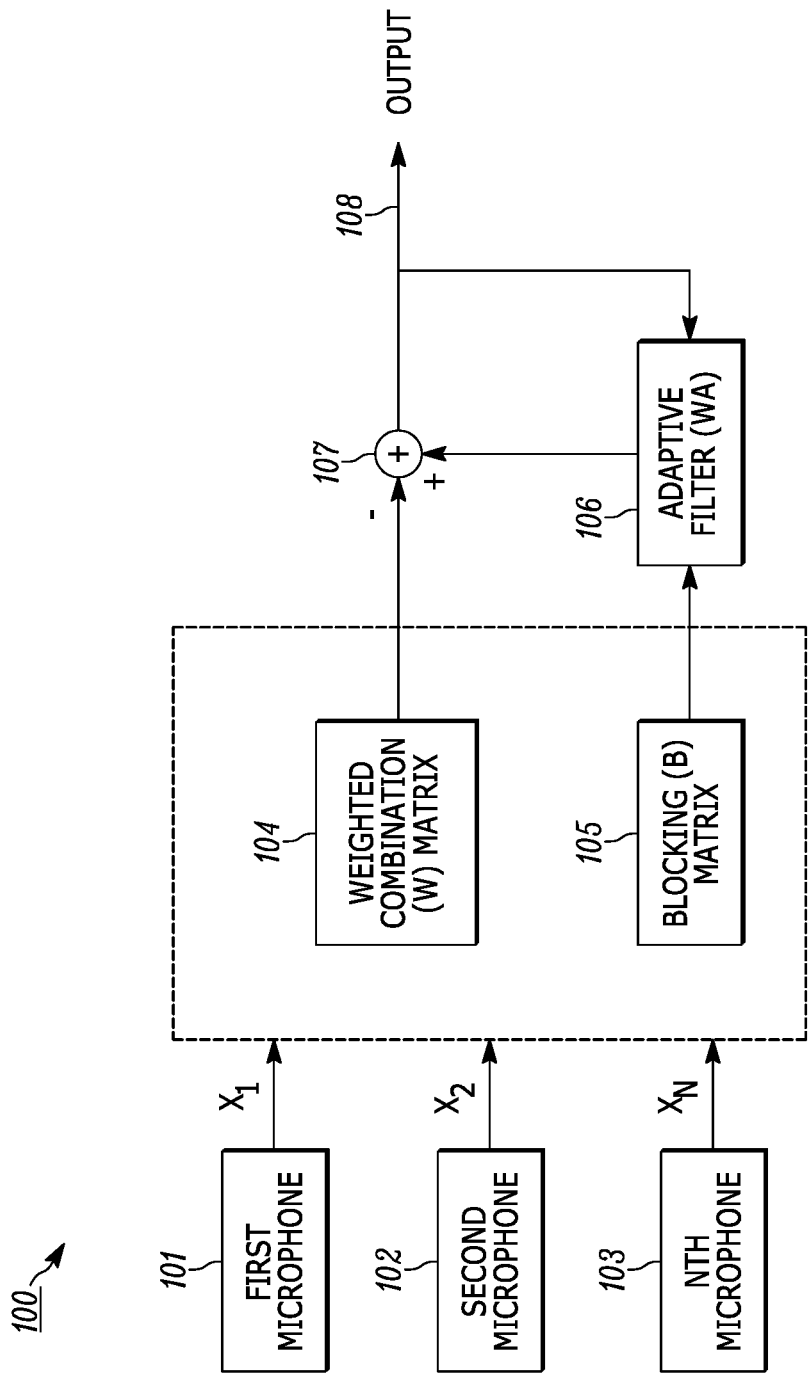
FIG. 1 is a hardware block diagram of an illustrative prior art adaptive microphone array.

FIG. 1 is a hardware block diagram of an illustrative prior art real-time adaptive microphone array 100. The array 100 array is configured for gathering signals from one or more desired directions in a main lobe of the array 100, and is also configured for reducing side interference gathered from one or more sources of acoustic energy that are not situated within the main lobe of the array 100. The array 100 includes a respective plurality of microphones, such as a first microphone 101, a second microphone 102, and an $N^{th}$ microphone 103, that are configured for gathering a corresponding plurality of signals $X_1$, $X_2$, and $X_N$ in real time.

The real-time adaptive microphone array 100 relies on orthogonalizing space, such that a first set of signals comprising signals from a desired target, and a second set of signals comprising undesired interference signals, are both included in a weighted combination (W) matrix 104. The W matrix 104 provides an output comprising some combination of the multiple microphone signals from the first, second, and Nth microphones 101, 102, and 103. A blocking (B) matrix 105 provides an output that ideally includes only the second set of signals, representing the interference signals. An adaptive filter Wa 106 generates an adaptively filtered output signal by applying a set of weights to the output of the B matrix 105, and a summer 107 subtracts the adaptively filtered output signal from the output of the W matrix 104 to provide an array output signal 108. The weights of the adaptive filter Wa 106 are selected such as to minimize the presence of the second set of signals in the array output signal 108. Thus, the presence of the interference signals is minimized in the array output signal 108.

Figure 2:
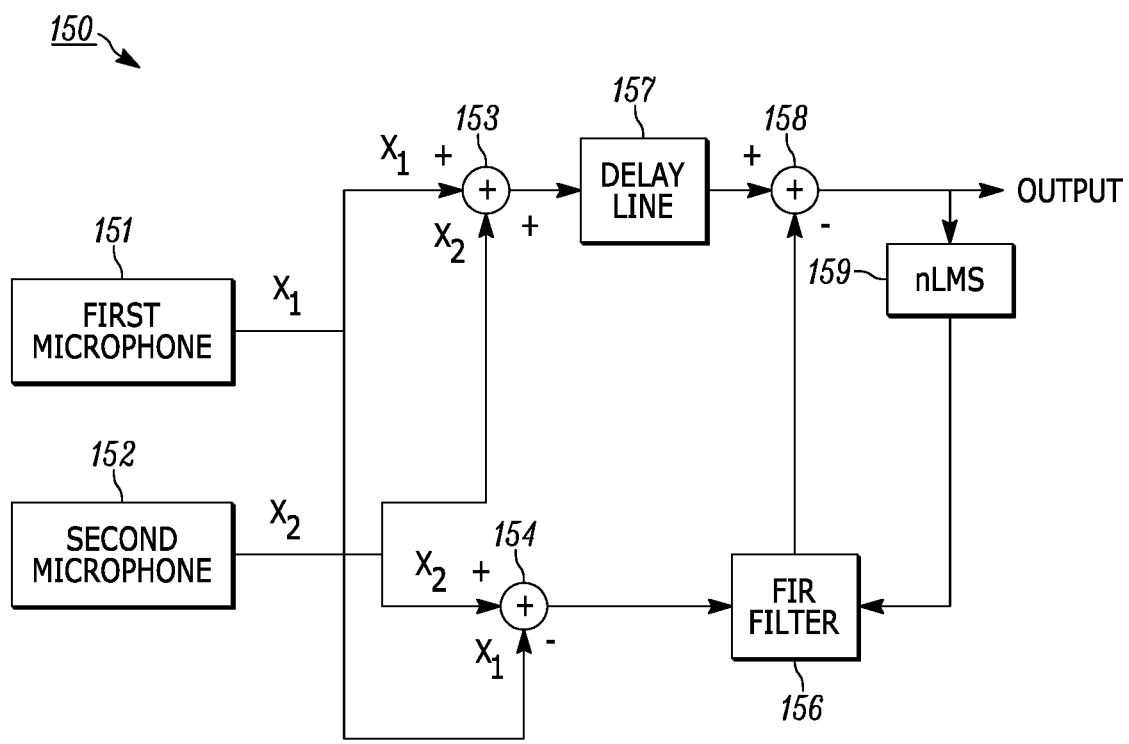
FIG. 2 is a hardware block diagram of an illustrative prior art adaptive microphone array for cancelling side interference.

FIG. 2 is a hardware block diagram of an illustrative prior art real-time adaptive microphone array 150 for cancelling side interference. A first output signal from a first microphone 151 is applied to a first non-inverting input of a first summer 153. A second output signal from a second microphone 152 is applied to a second non-inverting input of the first summer 153. The first summer 153 generates a sum of the first and second output signals to provide a spatially defined directional pattern having a maximum sensitivity in a direction perpendicular to a line that connects or joins the first and second microphones 151 and 152. This direction of maximum sensitivity may be regarded as an intended look-up direction of the array. The sum provided by the first summer 153 is fed to an input of a delay line 157. An output of the delay line 157 is applied to a non-inverting input of a third summer 158.

A second summer 154 is used to invert either the first output signal from the first microphone 151 or the second output signal from the second microphone 152 prior to summing the first and second output signals, to generate a difference signal between the first microphone 151 and the second microphone 152. The difference signal provides a minimum sensitivity along the look-up direction of the array, and provides a maximum sensitivity in a direction defined by the line connecting the two microphones. Thus the maximum sensitivity direction of the summation branch at the output of the first summer 153 coincides with the minimum sensitivity of the difference branch at the output of the second summer 154 of the array 150. The output of the difference branch at the output of the second summer 154 is then filtered by a finite impulse response (FIR) filter 156, which is trained using an adaptive algorithm such as normalized least mean squares (nLMS) 159, for example, to remove a maximum common signal that is present in both the sum and difference branches by means of a third summer 158. This maximum common signal is located to the sides of the look-up direction of the array 150. The nLMS algorithm represents a class of adaptive filter used to mimic a desired filter by determining a set of filter coefficients that produce a least mean square of an error signal. The error signal represents the difference between a desired signal and an actual signal. The nLMS algorithm constitutes a stochastic gradient descent method in that the filter is adapted based on the error at the current moment in time.

The arrays described in conjunction with FIGS. 1 and 2 may provide acceptable results as long as speech leakage is minimal (or ideally non-existent) in the output of the B matrix 105 (FIG. 1), or in the output of the second summer 154 (FIG. 2). In at least some embodiments or circumstances, speech leakage may be reduced or eliminated by implementing the sum and difference arrays using a larger number of microphones. Moreover, the look-up direction of the array can be steered by adding appropriate delays on one (or more of) the microphone signals. But there are practical limits to the maximum number of microphones that can be used, and there are also limitations with regard to a delay and sum beam former (DSB) approach. Reducing leakage to a tolerable level may prove difficult or impossible to achieve.

The use of a DSB in either of the arrays 100, 150 of FIG. 1 or 2 presents challenges in the way that a directional spatial response pattern is formed. The directivity does not remain constant across a broad range of audible frequencies, but rather, the directivity is a function of frequency. Also, in the general case of a broad-side array such as the DSB, the directivity is symmetrical, exhibiting a maximum sensitivity on both sides of a line connecting or joining the two (or more) microphones 101, 102 (FIG. 1), or the two (or more) microphones 151, 152 (FIG. 2).

Another approach is to use a differential microphone array (DMA) that forms a signal oriented along an intended look-up direction comprising a main lobe of the array. Differential arrays are of relatively constant directivity (up to a specific frequency, dependent on the geometry of the array), and allow minimum sensitivity (a null) to be directed at two arbitrary angles, axially symmetric to the line connecting the two or more microphones. The differential array is an end-fire array, and the maximum sensitivity of the array is along the line connecting the two or more microphones.

Figure 3:
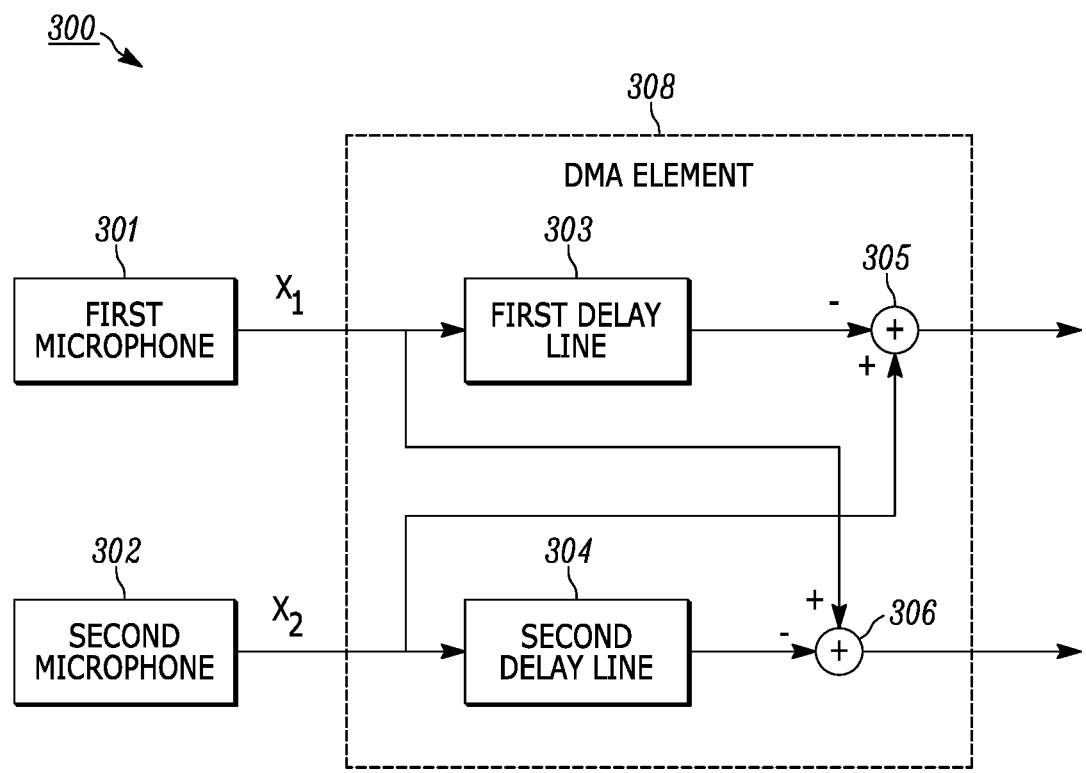
FIG. 3 is a hardware block diagram of a prior art differential microphone array.

FIG. 3 is a hardware block diagram of a prior art differential microphone array 300. In the differential microphone array 300, a first signal from a first microphone 301 is applied to a first delay line 303 that provides a first delay. A second signal from a second microphone 302 is applied to a second delay line 304 that provides a second delay. For illustrative purposes, the first delay could be of a time duration that is identical to the second delay, or alternatively, the second delay may be of a time duration that is different from the first delay. Also, for example, in some embodiments either of the first delay line 303 or the second delay line 304 can provide a frequency dependent delay.

The first signal from the first microphone 301 is delayed with respect to the second signal from the second microphone 302 by means of the first delay line 303, and the delayed first signal is subtracted from the second signal using a first summer 305. Likewise, the second signal from the second microphone 302 is delayed with respect to the first signal from the first microphone 301 by means of the second delay line 304, and the delayed second signal is subtracted from the first signal using a second summer 306.

The amount of delay introduced by the first and second delay lines 303, 304 and the geometry of the array 300 determine the direction of the null(s) formed by the array 300. For example, the first summer 305 may provide an output signal that illustratively implements a cardioid-shaped spatial response pattern, with the null of the cardioid directed to the left of the array 300, and with the main lobe of the cardioid directed to the right of the array 300. The second summer 306 may provide an output signal that illustratively implements a cardioid-shaped spatial response pattern, with the null of the cardioid directed to the right of the array 300, and with the main lobe of the cardioid directed to the left of the array 300. The first delay line 303, the second delay line 304, the first summer 305, and the second summer 306 together comprise a differential microphone array (DMA) element 308.

The delay introduced by the first and second delay lines 303, 304 may, but need not, be a function of frequency. It should be appreciated that any one or more of the delay lines 303, 304 (or otherwise) can take any of a variety of forms depending upon the embodiment or circumstance and, for example, can be an integer sample delay, a fractional sample delay, a frequency dependent delay, or a delay filter. Also, implementations may be provided in the time domain or the frequency domain. The array 300 conceptually illustrates how a set of processing elements (delay lines 303, 304 and summers 305, 306) may be used to produce signals with opposing spatial directivities, such as the right-oriented cardioid and left-oriented cardioid discussed previously.

Figure 4:
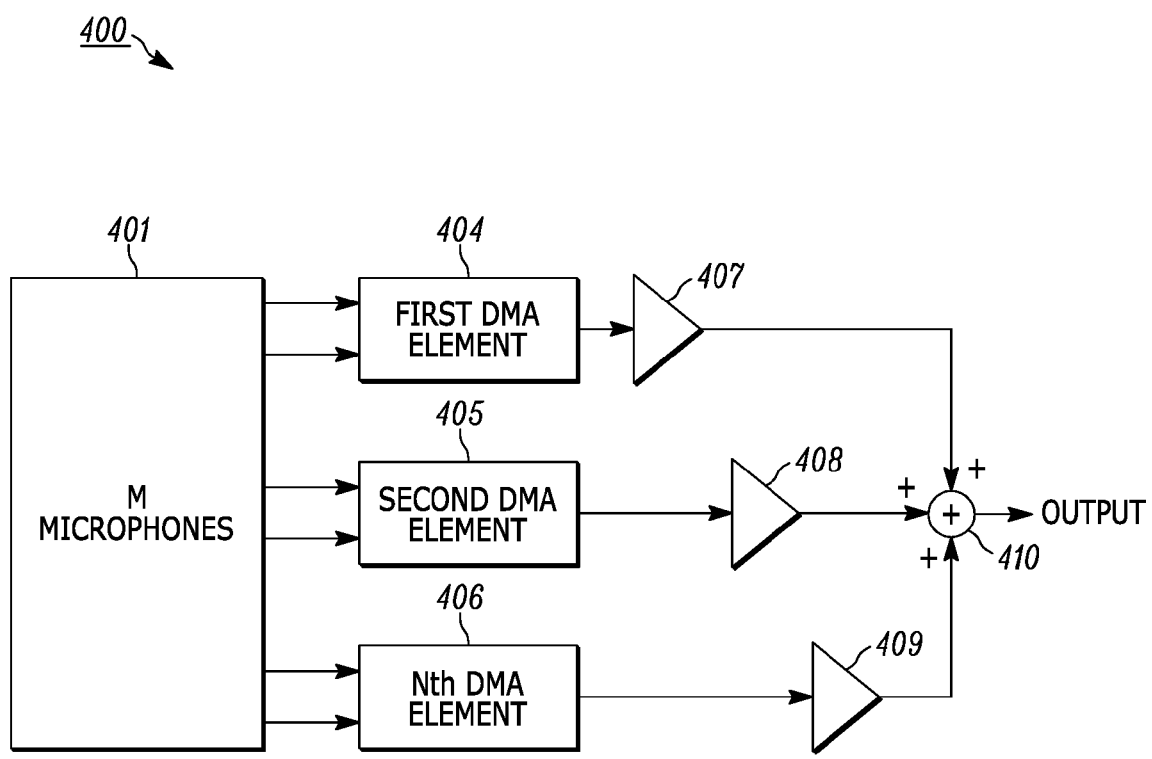
FIG. 4 is a hardware block diagram of another prior art differential microphone array.

FIG. 4 is a hardware block diagram of another prior art differential microphone array 400. The array 400 includes a plurality M of microphones 401, where M is a positive integer greater than one. Each of respective microphones of the plurality M of microphones 401 generates a corresponding microphone output signal. For explanatory purposes, assume that the plurality M of microphones 401 includes at least a first, a second, a third, and a fourth microphone. A first microphone output signal from the first microphone is fed to a first input of a first differential microphone array (DMA) element 404, and a second microphone output signal from the second microphone is fed to a second input of the first DMA element 404. Likewise, a third microphone output signal from the third microphone is fed to a first input of a second DMA element 405, and a fourth microphone output signal from the fourth microphone is fed to a second input of the second DMA element 405. For purposes of illustration, the first microphone output signal is fed to a first input of an Nth DMA element 406, and the fourth microphone output signal is fed to a second input of the Nth DMA element 406. Each of the first, second, and third DMA elements 404, 405 and 406 may be identical or similar to the DMA element 308 of FIG. 3.

An output of the first DMA element 404 is fed to an input of a first amplifier 407, an output of the second DMA element 405 is fed to an input of a second amplifier 408, and an output of the Nth DMA element 406 is fed to an input of an Nth amplifier 409. Each amplifier may provide frequency dependent amplification. An output of the first amplifier 407 is fed to a first non-inverting input of a summer 410. An output of the second amplifier 408 is fed to a second non-inverting input of the summer 410. An output of the Nth amplifier 409 is fed to an Nth non-inverting input of the summer 410. An output from the summer 410 is regarded as the output of the array 400. The characteristics of the first, second, and Nth DMA elements 404, 405 and 406 may each be adjusted, along with the gains provided by each of the first, second, and third amplifiers 407, 408, and 409 to provide any of a plurality of spatial directivity patterns. Provided that certain conditions are met, including an adequate spatial distribution of physical microphones, any number of microphones 401, 402, 403, DMA elements 404, 405, 406, and amplifiers 407, 408, 409 can be linearly combined by the summer 410, to form spatial directivity patterns of arbitrary shapes and orientations.

Figure 5:
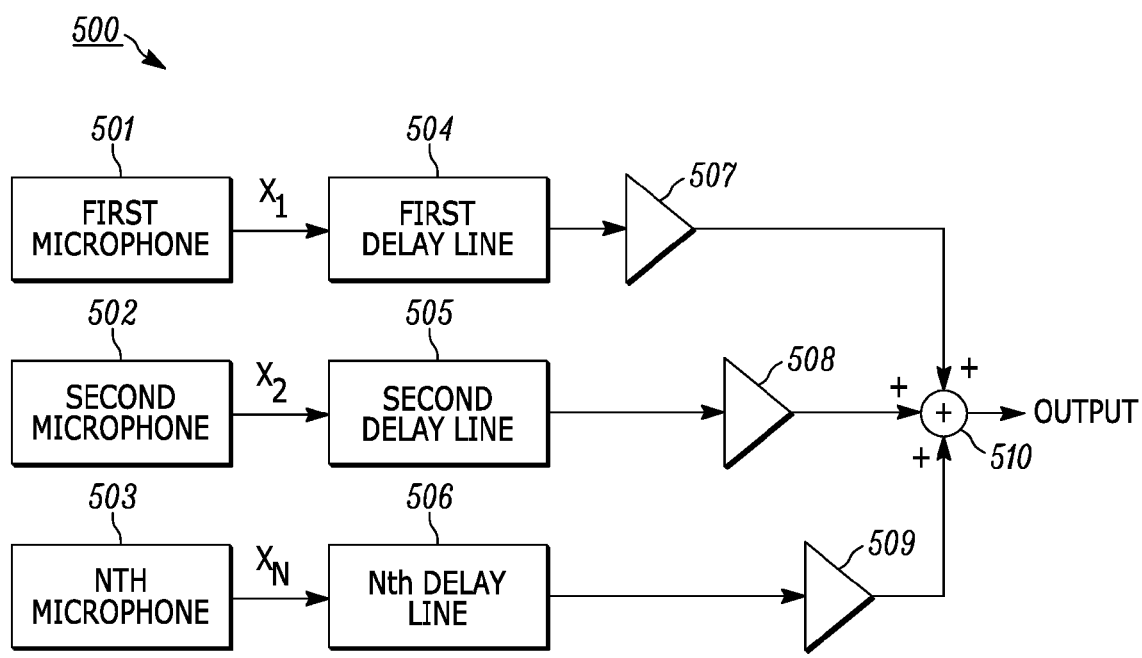
FIG. 5 is a hardware block diagram of yet another prior art microphone array.

FIG. 5 is a hardware block diagram of a prior art delay and sum beam former (DSB) microphone array 500. The array 500 includes a respective plurality of microphones, such as a first microphone 501, a second microphone 502, and an Nth microphone 503, that are configured for providing a corresponding plurality of output signals $X_1$, $X_2$, and $X_N$ in real time. The output signal $X_1$ from the first microphone 501 is fed to an input of a first delay line 504. Likewise, the output signal $X_2$ from the second microphone 502 is fed to an input of a second delay line 505. Similarly, the output signal $X_N$ from the Nth microphone 503 is fed to an input of an Nth delay line 506. An output of the first delay line 504 is fed to an input of a first amplifier 507, an output of the second delay line 505 is fed to an input of a second amplifier 508, and an output of the Nth delay line 506 is fed to an input of an Nth amplifier 509.

An output of the first amplifier 507 is fed to a first non-inverting input of a summer 510. An output of the second amplifier 508 is fed to a second non-inverting input of the summer 510. An output of the Nth amplifier 509 is fed to an Nth non-inverting input of the summer 510. An output from the summer 510 is regarded as the output of the array 500. The delays provided by the first, second, and Nth delay lines 504, 505, and 506 may each be adjusted, along with the gains provided by each of the first, second, and third amplifiers 507, 508, and 509 to provide any of a plurality of spatial directivity patterns. Provided that certain conditions are met, including an at least minimal spatial distribution of physical microphones, any number of microphones 501, 502, 503, delay lines 504, 505, 506, and amplifiers 507, 508, 509 can be linearly combined by the summer 510, to form spatial directivity patterns of arbitrary shapes and orientations.

According to a set of illustrative embodiments disclosed herein, methods are provided for performing adaptive equalization of an adaptive microphone array. For illustrative purposes, the adaptive microphone array may, but need not, be implemented using any of the systems described previously in connection with FIGS. 1-5. When operated using conventional approaches, the arrays of FIGS. 1-5 have a tendency to produce undesired degradation of gathered signals. For example, such degradations may adversely impact proper operation of speech recognition algorithms.

According to a set of illustrative embodiments, a real-time adaptive microphone array receives a signal subject to degradation from a source that is located in a look-up direction of the array. The degradation is modeled using a mirrored adaptive microphone array to process one or more test signals. The modeled degradation is used to derive an equalizer that is continuously or repeatedly adapted for removing, minimizing, or reducing the degradation. The mirrored adaptive microphone array can be of the same architecture and configuration as the real-time adaptive microphone array. Alternatively or additionally, the same microphone array can be used to implement both the real-time adaptive microphone array and the mirrored adaptive microphone array. The test signal processed by the mirrored adaptive microphone array is a signal recorded in free field (or near free field) conditions in environment with minimal external noise and interference. The test signal can be a broad-band noise, or a signal having similar spectral characteristics as that of the intended target. The test signal source is physically located in the look-up direction of the array. Multiple directions with reference to the physical geometry of the microphone array, or with respect to the look-up direction of the mirrored adaptive microphone array, can be covered (in terms of equalizing in that particular orientation) using test signals recorded from sources located in these respective directions.

During operation, the real-time adaptive microphone array continuously or repeatedly changes its configuration, while reacting to the presence of interference in the environment. These configuration changes are then reflected in the mirrored adaptive microphone array by copying a set of configuration parameters from the real-time adaptive microphone array. These configuration parameters may include, for example, filter coefficients, filter gains, and other types of parameters. The mirrored adaptive microphone array then continuously or repeatedly model any target signal degradation by processing the pre-recorded test signal. The mirrored adaptive microphone array provides an input to an estimator, which calculates an equalizer for minimizing the modeled degradation (and, thus, the observed degradation). Once estimated, the equalizer configuration is used to process the output produced by the real-time adaptive microphone array, thus mitigating any spectral degradation to the target signal, located in the look-up direction of the array. Equalizer configuration changes continuously or repeatedly, following the adaptation of the real-time adaptive microphone array.

Figure 6:
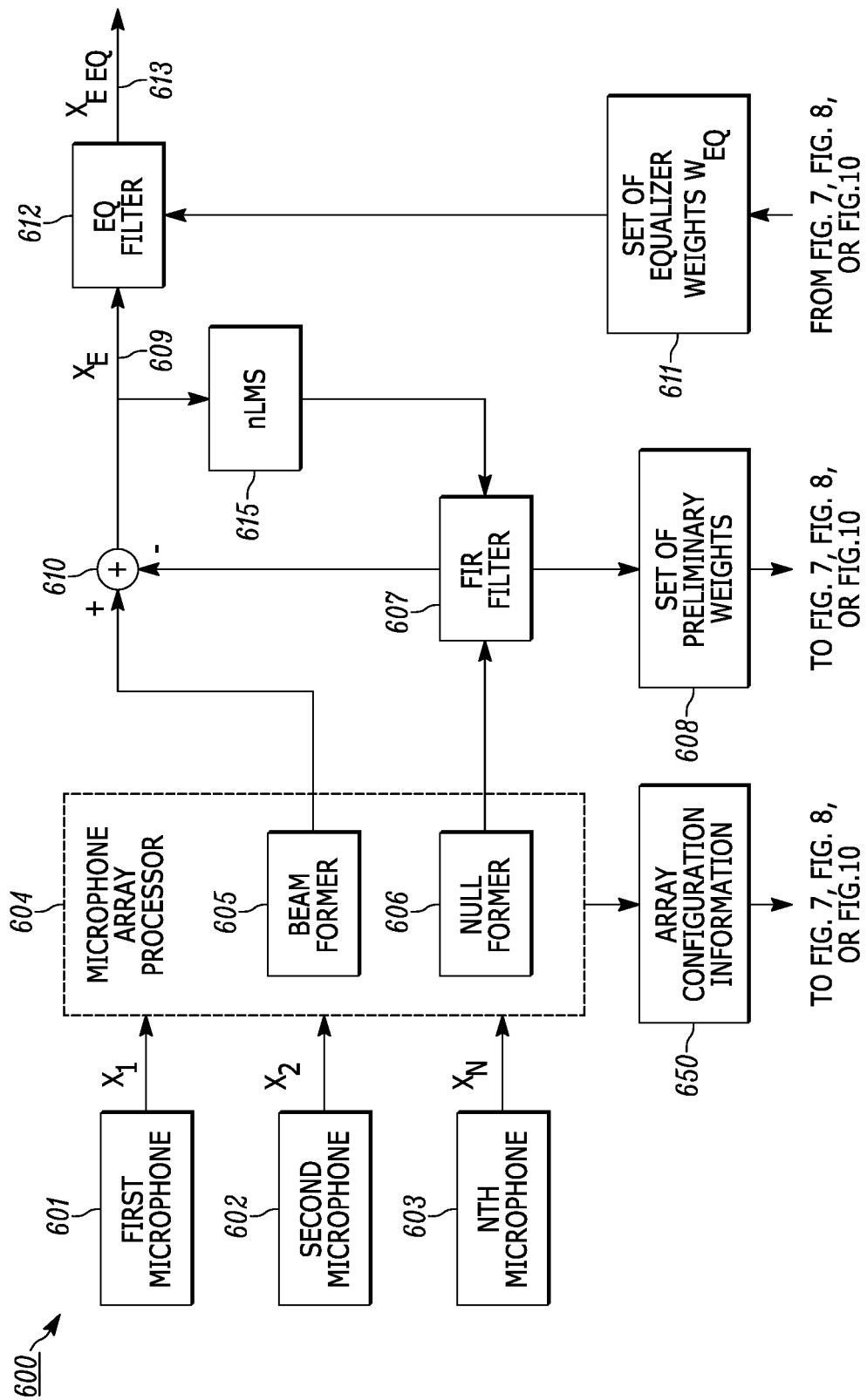
FIG. 6 is a hardware block diagram of a first illustrative real-time adaptive microphone array constructed in accordance with a set of exemplary embodiments.
Figure 7:
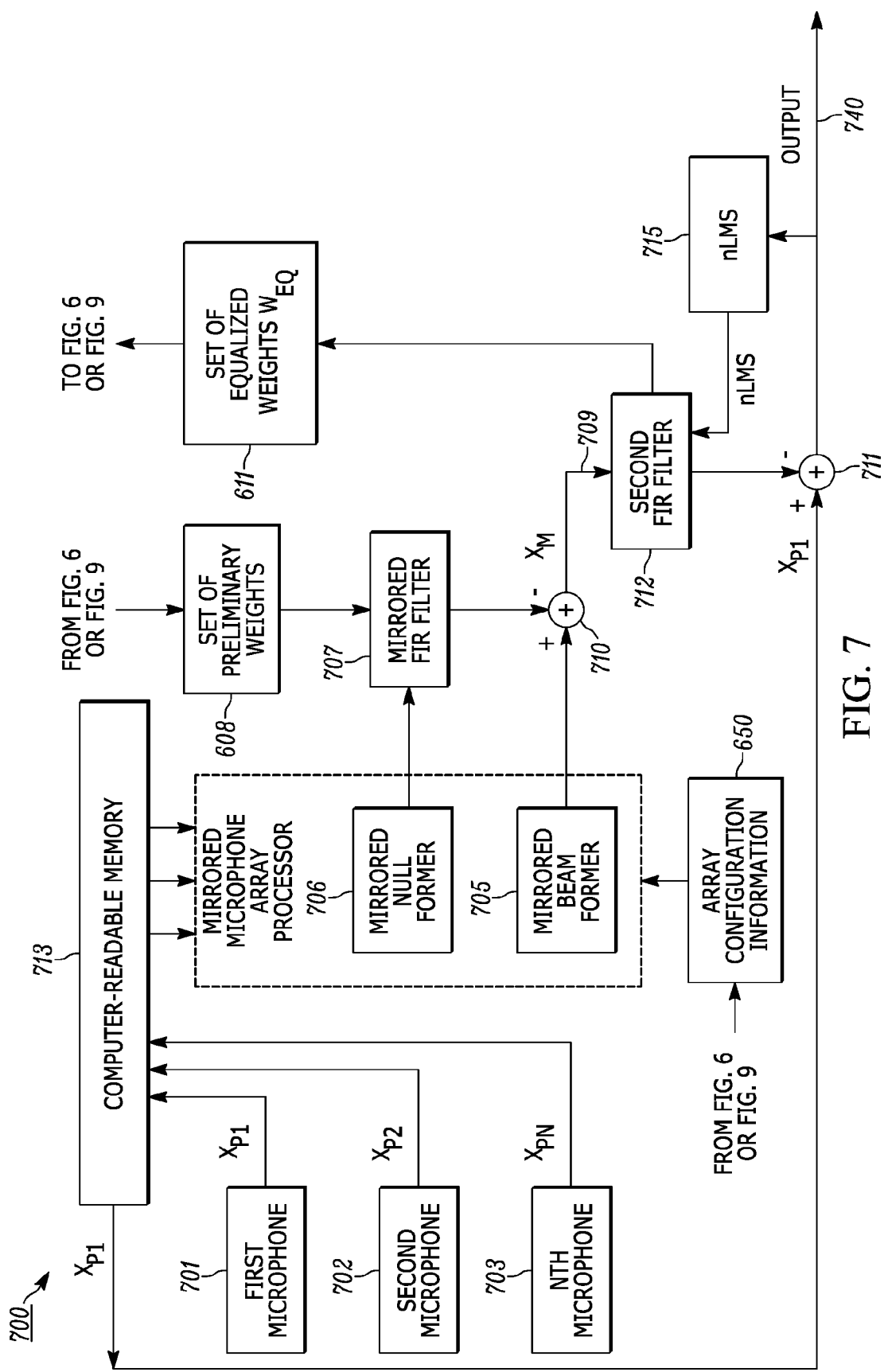
FIG. 7 is a hardware block diagram of a first illustrative mirrored adaptive microphone array constructed in accordance with a set of exemplary embodiments.

Refer now to FIGS. 6 and 7 which together comprise a hardware block diagram of a first illustrative real-time adaptive equalization system constructed in accordance with a set of exemplary embodiments. FIG. 6 shows a first illustrative real-time adaptive microphone array 600, and FIG. 7 shows a first illustrative mirrored adaptive microphone array 700. However, it should be understood that separate physical elements could, but need not, be used to implement the real-time adaptive microphone array 600 (FIG. 6) and the mirrored adaptive microphone array 700 (FIG. 7). Alternatively or additionally, some or all of the physical elements of the real-time adaptive microphone array 600 (FIG. 6) may be shared with corresponding physical elements of the mirrored adaptive microphone array 700 (FIG. 7).

The real-time adaptive microphone array 600 (FIG. 6) is configured for gathering signals from one or more desired directions in a main lobe of the array 600, and is also configured for reducing side interference gathered from one or more sources of acoustic energy that are not situated within the main lobe of the array 600. The array 600 includes a respective plurality of microphones, such as a first microphone 601, a second microphone 602, and an $N^{th}$ microphone 603, that are configured for gathering a corresponding plurality of signals $X_1$, $X_2$ and $X_N$ in real time.

The signals $X_1$, $X_2$ and $X_N$ gathered by the first, second, and Nth microphones 601, 602, and 603 are fed to a microphone array processor 604. The microphone array processor 604 includes a beam former 605 and a null former 606. The null former 606 may be regarded as a blocking matrix. The beam former 605 produces an output that contains a first set of signals comprising one or more signals from a desired target, and a second set of signals comprising undesired signals from interference sources. Thus, the beam former 605 provides an output comprising some combination of the multiple microphone signals from the first, second, and Nth microphones 601, 602, and 603. The null former 606 is configured to provide an output signal such that the first set of signals, representing signals from the desired source, are greatly attenuated. The output signal of the null former 606 primarily includes the second set of signals, representing the interference signals.

The output signal from the null former 606 is fed to an adaptive filter which, by way of example, may be a finite impulse response (FIR) filter 607. The FIR filter 607 is trained to remove the interference sources present and dominant in the output signal from the null former 606. The FIR filter 607 generates an adaptively filtered output signal by applying a set of weights to the output of the null former 606 and subtracting the result out of the output of the beam former 605. The weights of the FIR filter 607 are selected such as to minimize the presence of the second set of signals in the adaptively filtered output signal. The plurality of signals $X_1$, $X_2$ and $X_N$ are processed by the microphone array processor 604 and the FIR filter 607 to provide a preliminary output signal $X_E$ 609 and a set of preliminary weights 608.

The microphone array processor 604 includes the beam former 605 and the null former 606. The microphone array processor 604 may transmit array configuration information 650 to the mirrored adaptive microphone array 700 (FIG. 7). The null former 606 (FIG. 6) can include a matrix representing difference information between respective pairs of at least some of the plurality of microphones. The null former 606 is configured to orthogonalize space, such that signals from a desired source are blocked. The null former 606 can be realized by some combination of directional elements, so that a null is steered towards the frontal, look-up direction, or the direction in which the target/desired signal source is located. It is assumed herein that the desired source is situated at a particular orientation or set of orientations with reference to the real-time adaptive microphone array 600. Likewise, the null former 606 can be realized using a differential microphone element, or combination of such elements, intended to form an output signal which excludes signals from the desired source, such as the DMA element 308 of FIG. 3. The difference information produced by the differential microphone element includes a gradient that is indicative of a sensitivity of a combination of signals from microphones 601, 602, and 603 (FIG. 6) towards an acoustic source situated in the main lobe. For purposes of illustration, the microphones 601, 602, and 603 may, but need not, be omnidirectional. The null former 606 can be implemented by using a set of differential microphone elements, and combinations of those, as illustrated in any of FIG. 3 or 4. The output of the null former 606 (FIG. 6) primarily includes undesired side interference outside of the main lobe of the array.

The beam former 605 provides a signal that is indicative of a sum or combination of the signals $X_1$, $X_2$ and $X_N$ gathered by the first, second, and $N^{th}$ microphones 601, 602, and 603, where this sum or combination primarily includes signals gathered from the main lobe of the array. The beam former 605 can be realized, either as a delayed sum of signals, as shown in FIG. 5, or as a combination of directional elements as shown in FIG. 4. The output of the null former 606 (FIG. 6) is operatively coupled to the finite impulse response (FIR) filter 607, and the output of the beam former 605 is operatively coupled to a non-inverting input of a summer 610.

For purposes of illustration, the FIR filter 607 may be configured to implement a procedure such as a normalized least mean squares (nLMS) 615 algorithm. The nLMS 615 algorithm represents a class of adaptive filter used to mimic a desired filter by determining a set of filter coefficients that produce a least mean square of an error signal. The error signal is the difference between a desired signal and an actual signal. The nLMS 615 algorithm may be conceptualized as a stochastic gradient descent method, in that the algorithm is adapted based on the error at the current moment in time.

The FIR filter 607 includes a delay line that is implemented using a set of memory elements. The FIR filter 607 exhibits an "impulse response" in the form of a set of FIR coefficients. If an impulse, such as a single "1" sample followed by many "0" samples, is fed to the input of the FIR filter 607, the output of the filter will be a set of coefficients where the "1" sample sequentially moves past each coefficient in turn to form the output of the FIR filter 607. In the example of FIG. 6, an output of the FIR filter 607 represents the set of preliminary weights 608.

Illustratively, the FIR filter 607 could, but need not, be implemented using a digital signal processor (DSP) microprocessor that is configured for executing one or more looped instructions. The FIR filter 607 may be configured for performing multi-rate applications such as decimation (reducing the sampling rate), interpolation (increasing the sampling rate), or both. One or more taps may be provided by the FIR filter 607 where each tap represents a coefficient/delay pair. The number of FIR taps may be selected in accordance with a desired amount of filtering to be performed by the FIR filter 607. Using a greater number of taps provides a more accurate representation of the transfer function that the FIR filter 607 is modeling/tracking.

The output of the FIR filter 607 is provided to an inverting input of the summer 610. A non-inverting output of the summer 610 represents the preliminary output signal $X_E$ 609. The preliminary output signal $X_E$ 609 includes signals gathered from the main lobe of the array 500, with substantially little or no interference from sources of acoustic energy that are situated outside of the main lobe. However, it may be noted that temporal and spatial information included in the signals $X_1$, $X_2$, and $X_N$ collected by the array 600 are estimated using array signal processing and adaptation procedures to formulate a filter transfer function for the FIR filter 607 of the array 600. These array signal processing and adaptation procedures may have the undesirable property of degrading signals of interest in the main lobe of the array 600. This degradation is caused by speech leakage affecting the adaptation procedure executed by the array 600, as well as artifacts caused by the filter transfer function.

The preliminary output signal $X_E$ 609 is fed to an input of an equalizer (EQ) filter 612. The EQ filter 612 applies a set of equalizer weights $W_{EQ}$ 611 provided by the mirrored adaptive microphone array 700 (FIG. 7) to the preliminary output signal $X_E$ 609 to provide an equalized output signal $X_{E\ EQ}$ 613. The equalized output signal $X_E$ EQ 613 reduces or eliminates the degradation of signals of interest in the main lobe of the array 600.

Refer now to FIG. 7 which illustrates the mirrored adaptive microphone array 700. The mirrored adaptive microphone array 700 is used to estimate the degradation which a desired source located at a specific directional bearing with respect to the real-time adaptive microphone array 600 (FIG. 6) will suffer as an undesired by-product of the side interference being reduced, given the current state of processing in the real-time adaptive microphone array 600. As mentioned previously, it should be understood that separate physical elements could, but need not, be used to implement the real-time adaptive microphone array 600 (FIG. 6) and the mirrored adaptive microphone array 700 (FIG. 7). Alternatively or additionally, some or all of the physical elements of the real-time adaptive microphone array 600 (FIG. 6) may be shared with corresponding physical elements of the mirrored adaptive microphone array 700 (FIG. 7).

The mirrored adaptive microphone array 700 mirrors the real-time adaptive microphone array 600 (FIG. 6), but the mirrored adaptive microphone array 700 operates on one or more test signals instead of signals that are gathered in real time. The one or more test signals are obtained using a desired source that is situated in a substantially free-field environment, free of acoustic reflections, interference, and noise.

For example, the one or more test signals may be obtained by using a point source (such as an artificial mouth, artificial larynx, loudspeaker, function generator, oscillator, or other source) producing acoustic energy in the form of white noise, pink noise, a test signal having a spectral content similar or identical to that of a desired target signal, a multi-tone signal, a pseudo-speech signal, or any of various combinations thereof. The one or more test signals are recorded and stored in a computer readable memory device. For example, the test signals may be recorded, as described, using the mirrored adaptive microphone array 700 (FIG. 7), or the real-time adaptive microphone array 600 (FIG. 6), or an adaptive microphone array that is representative of the real-time adaptive microphone array 600, or may also be a result of simulation using a mathematical model. The recording of the test signals may be performed in free (or near free) field conditions, in the absence of noise and interference. The test signals can be recorded using the microphones 601, 602, and 603 (FIG. 6) of the real-time adaptive microphone array 600, or using the microphones 701, 702, and 703 of the mirrored adaptive microphone array 700 (FIG. 7). Alternatively or additionally, the test signals can obtained using a test fixture in the form of an external test microphone, a test loudspeaker, or a test microphone feeding a test loudspeaker via an audio amplifier, to produce acoustic energy, while all microphone signals from the mirrored adaptive microphone array 700 are recorded simultaneously for a given bearing or direction of interest of the array 700 relative to the test fixture.

The mirrored adaptive microphone array 700 (FIG. 7) is configured for gathering test signals received by the array at one or more angular bearings with respect to the array. The array 700 includes a respective plurality of microphones, such as a first microphone 701, a second microphone 702, and an $N^{th}$ microphone 703, that are configured for gathering a corresponding plurality of signals $X_{P1}$, $X_{P2}$, and $X_{PN}$ in a test environment and storing them in a computer-readable memory 713 for use during real-time operation during normal use of the real-time adaptive microphone array 600 (FIG. 6). The plurality of signals $X_{P1}$, $X_{P2}$, and $X_{PN}$, as retrieved from the computer-readable memory 713 and the set of preliminary weights 608 (FIGS. 6 and 7) are then processed by the array 700 (FIG. 7) to provide the set of equalizer weights 611 to the EQ filter 612 of FIG. 6. The set of equalizer weights 611 and the preliminary output signal $X_E$ are then applied to the EQ filter 612 to produce an equalized output signal $X_{E\_EQ}$ 613.

The computer-readable memory 713 (FIG. 7) is configured for storing the one or more test signals. The test signals are gathered by a set of microphones which, in the present example, include the first microphone 701, the second microphone 702, and the $N^{th}$ microphone 703. However, two different sets of microphones need not be used for the mirrored adaptive microphone array 700 and the real-time adaptive microphone array 600 (FIG. 6). For example, the first microphone 701 may be implemented using the first microphone 601 (FIG. 6), the second microphone 702 (FIG. 7) may be implemented using the second microphone 602 (FIG. 6), and the Nth microphone 703 (FIG. 7) may be implemented using the Nth microphone 603 (FIG. 6). Alternatively or additionally, the mirrored adaptive microphone array 700 (FIG. 7) may include a set of microphones 701, 702 and 703 that are provided in the form of a single test array for use with a plurality of real-time adaptive microphone arrays 600 (FIG. 6), wherein the single test array is a representative sample for a set of real-time adaptive microphone arrays 600 produced in a production environment.

The set of equalizer weights 611 (FIGS. 6 and 7) may be provided, for example, by applying the plurality of signals $X_{P1}$, $X_{P2}$, and $X_{PN}$ to a mirrored beam former 705 and a mirrored null former 706. Alternatively, the mirrored adaptive microphone array 700 may utilize the beam former 605 and null former 606 of FIG. 6. The mirrored beam former 705 and the mirrored null former 706 may be provided in the form of a mirrored microphone array processor 704. The mirrored beam former 705 (FIG. 7) provides a signal that is indicative of a sum or combination of the signals $X_1$, $X_2$, and $X_N$ gathered by the first, second, and $N^{th}$ microphones 701, 702, and 703, where this sum or combination primarily includes signals gathered from the main lobe of the array. The output of the mirrored null former 706 is operatively coupled to a mirrored finite impulse response (FIR) filter 707, and the beam former 705 is operatively coupled to a non-inverting input of a summer 710. Alternatively, the mirrored adaptive microphone array 700 may utilize the FIR filter 607 and the summer 610 of FIG. 6.

The mirrored FIR filter 707 (FIG. 7) may include a delay line that is implemented using a set of memory elements. The mirrored FIR filter 707 exhibits an "impulse response" in the form of a set of FIR coefficients. If an impulse, such as a single "1" sample followed by many "0" samples, is fed to the input of the mirrored FIR filter 707, the output of the filter will be a set of coefficients where the "1" sample sequentially moves past each coefficient in turn to form the output of the mirrored FIR filter 707. Illustratively, the mirrored FIR filter 707 could, but need not, be implemented using a digital signal processor (DSP) microprocessor that is configured for executing one or more looped instructions. Illustratively, the mirrored FIR filter 707 could be implemented using the FIR filter 607 of FIG. 6.

The output of the mirrored FIR filter 707 (FIG. 7) is provided to an inverting input of a first summer 710. The output of the mirrored null former 706 is provided to the input of the mirrored FIR filter 707. The output of the mirrored beam former 705 is provided to a non-inverting input of the first summer 710. A non-inverting output of the first summer 710 is applied to a second FIR filter 712. The second FIR filter 712 is not a mirrored filter, in the sense that it does not obtain its configuration from the real-time adaptive microphone array 600 of FIG. 6 as a copy. Rather, the second FIR filter 712 (FIG. 7) operates on its own to determine appropriate equalizer weights. The second FIR filter 712 may be configured to implement an nLMS 715 algorithm. The output of the first summer 710 is a signal $X_M$ 709. The signal $X_M$ 709 is filtered through an adaptive filter comprising the second FIR filter 712.

The mirrored adaptive microphone array 700 (FIG. 7) attempts to minimize the difference between a recorded test signal, representing the signal from an unaffected or ideal desired source, unaffected by the operation of the real-time adaptive microphone array 600 (FIG. 6), and the signal $X_M$ 709. The signal $X_M$ 709 represents a degradation imparted on the desired source by the current state of operation of the real-time adaptive microphone array 600 (FIG. 6). The second FIR filter 712 (FIG. 7) uses as input the signal $X_M$ 709, and provides its output to an inverting input of a second summer 711.

A test signal Xp1 is provided to a non-inverting input of the second summer 711. The output of the second summer 711, which represents the difference between the output of the second FIR filter 712 and test signal Xp1, is used by the nLMS algorithm 715 to control the weights of the second FIR filter 712. The test signal $X_{P1}$ is recorded and stored from a physical microphone, such as the first microphone 701. Alternatively or additionally, the test signal $X_{P1}$ can be obtained from a test microphone that is not one of the devices in the mirrored adaptive microphone array 700. Likewise, the test signal $X_{P1}$ can be obtained from a virtual microphone. Alternatively or additionally, the test signal $X_{P1}$ can be calculated from a mathematical model or simulation.

The second FIR filter 712 produces the set of equalizer weights $W_{EQ}$ 611 (FIGS. 6 and 7) by minimizing an error output of the FIR filter 712 (FIG. 7) representing the difference between the signal $X_M$ 709 and the test signal $X_{P1}$. The set of equalizer weights $W_{EQ}$ 611 compensates for any degradation in signals of interest that are gathered from the main lobe of the real-time adaptive microphone array 600 (FIG. 6). This degradation is caused by speech leakage affecting the adaptation procedure executed by the array 600, as well as artifacts caused by the filter transfer function.

The output 740 of the mirrored adaptive microphone array 700 (FIG. 7) can be used to provide ongoing or repeated estimates of the detrimental effects of the current real-time adaptive microphone array 600 (FIG. 6) on the desired signal in the direction of interest. The mirrored adaptive microphone array 700 (FIG. 7) determines optimized or appropriate equalizer filter weights 611 in view of one or more recorded test signals that were obtained with one or more of the microphones 701, 702, 703 under idealized test conditions. Once the optimal filter weights are obtained, they are used to filter the output $X_{E\_EQ}$ 613 of the real-time adaptive microphone array 600 (FIG. 6).

The real-time adaptive microphone array 600 may contain time-adapting elements whose operation is reflected in the mirrored adaptive microphone array 700 (FIG. 7), in response to array configuration information 650 being sent from the real-time adaptive microphone array 600 (FIG. 6) to the mirrored adaptive microphone array 700 (FIG. 7). The array configuration information 650 may include one or more microphone configuration parameters, such as a set of time delay values, phases, and gains applied to each microphone in the array. In some embodiments, use of adaptive microphone arrays may not be required. In such cases, an alternative embodiment as shown in FIG. 8 may be employed.

Figure 8:
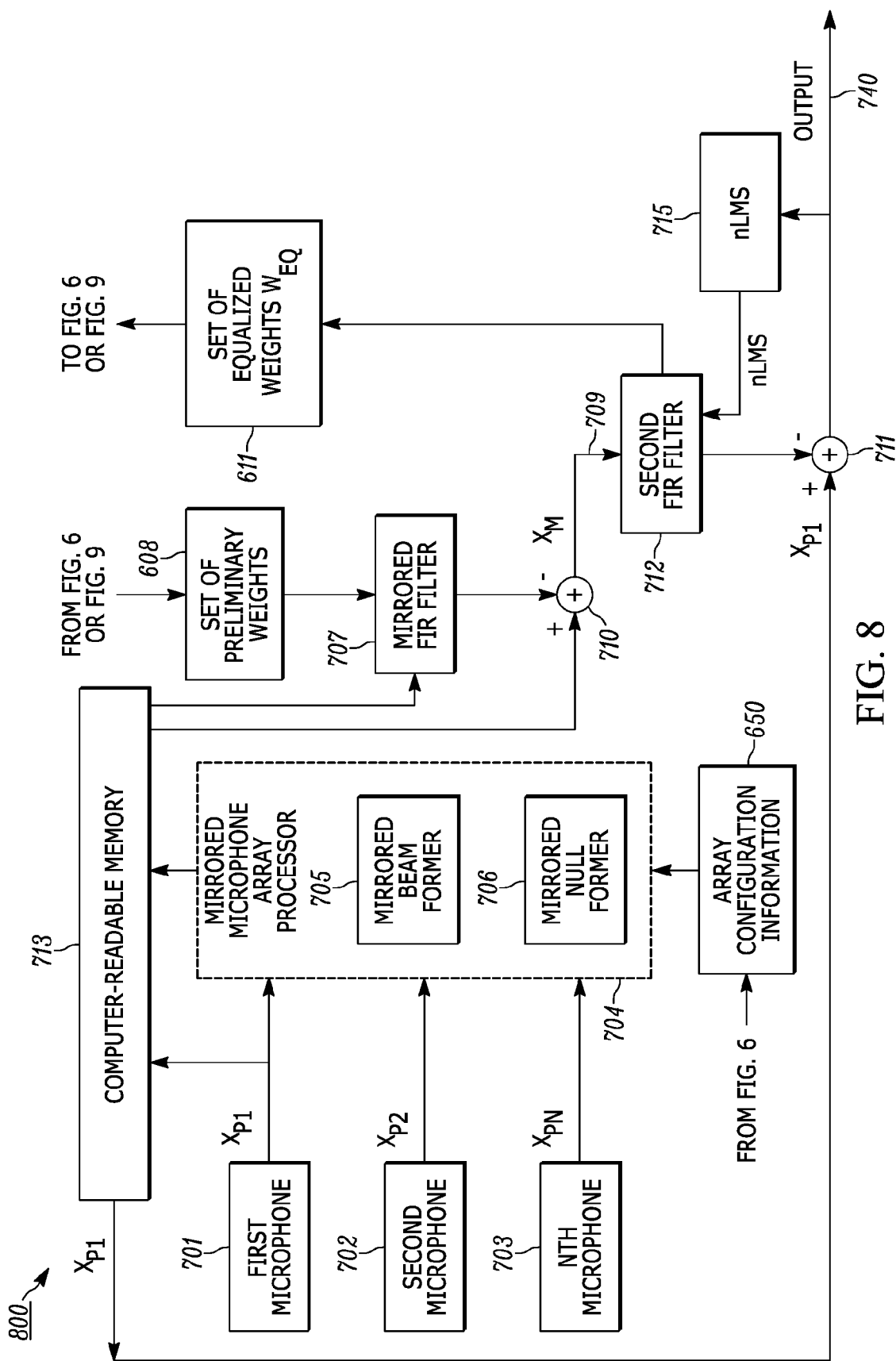
FIG. 8 is a hardware block diagram of a second illustrative mirrored adaptive microphone array constructed in accordance with another set of exemplary embodiments.

FIG. 8 is a hardware block diagram of a second illustrative mirrored microphone array 800 constructed in accordance with another set of exemplary embodiments. For example, the mirrored microphone array 800 may, but need not, be employed as an alternative or in addition to the mirrored adaptive microphone array of FIG. 7. To facilitate understanding, identical reference numerals have been used in FIGS. 7 and 8, wherever possible, to designate identical elements that are common to these figures. The set of embodiments depicted in FIG. 8 can be used in cases where a microphone array does not include any time-varying elements. Thus, the output of the mirrored microphone array 800, rather than the recordings of the test signals from the set of microphones in the array, can be stored in the computer readable memory 713 (FIG. 8) and used together with the set of preliminary weights 608 to model desired signal degradation.

In the embodiment shown in FIG. 8, the real-time adaptive microphone array 600 (FIG. 6) produces the set of preliminary weights 608 (FIGS. 6 and 8), while the mirrored microphone array 800 (FIG. 8) will only be needed during the set-up/tuning phase, in order to configure the mirrored microphone array 800, and to produce and store its outputs in the computer readable memory 713. This approach provides some benefits in terms of reducing computational overhead and storage requirements.

During real-time operation, modeling a degradation of the desired source is achieved by providing the output of the null former 706 from the computer-readable memory 713 into the input of the mirrored filter 707. The output from the mirrored beam former 705, stored in the computer-readable memory 713, is provided to the non inverting input of the summation block 710. The output of the mirrored filter 707 is provided to the inverting input of the first summer 710. The output of the first summer 710 is a signal $X_M$ 709 that is provided to the input of the second FIR filter 712. The signal Xp1 is provided to the non-inverting input of the summation block 711. The output of the second summation block 711 which represents the difference between the output of filter 712 and test signal Xp1 is used by the nLMS algorithm 715 to control the weights of the second filter 712. A signal $X_{P1}$ as recorded and stored from either a physical microphone, such as the first microphone 701, or the $X_{P1}$ signal can be obtained from a test microphone that is not one of the devices in the mirrored adaptive microphone array 800. Likewise, the $X_{P1}$ signal can be obtained from a virtual microphone. Alternatively this signal can be calculated from a mathematical model or simulation.

Figure 9:
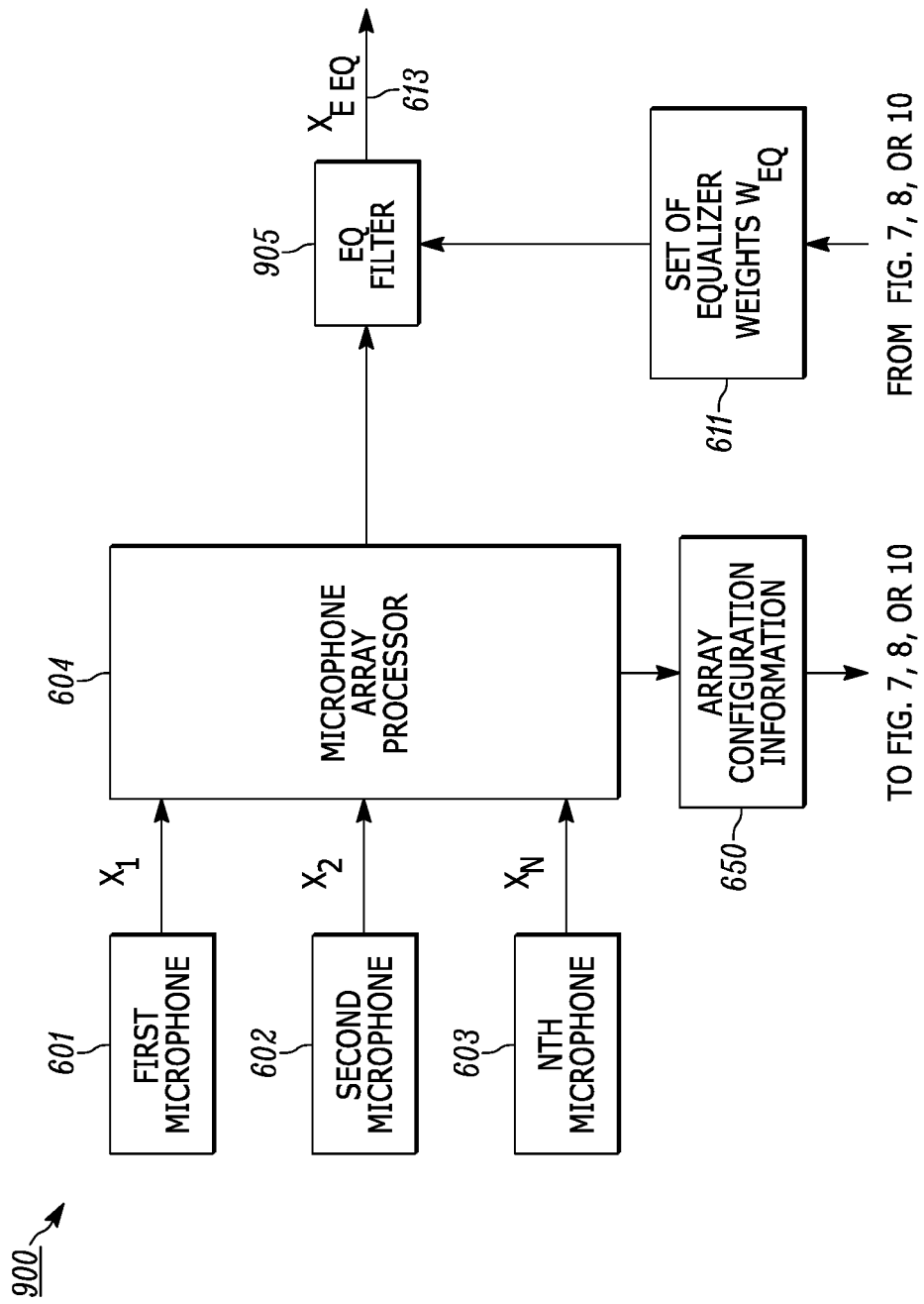
FIG. 9 is a hardware block diagram illustrating a second real-time adaptive microphone array constructed in accordance with another set of exemplary embodiments.

FIG. 9 is a hardware block diagram illustrating a second real-time adaptive microphone array 900 constructed in accordance with another set of exemplary embodiments. To facilitate understanding, identical reference numerals have been used in FIGS. 6 and 9, wherever possible, to designate identical elements that are common to these figures. Any of a variety of adaptive microphone systems may be employed to implement the real-time adaptive microphone array 900, so long as their operation can be mirrored in order to model undesirable degradation to the target signal, and in order to estimate an equalizer to minimize such degradation. Similarly, various methods of deriving an equalizer based on observed correlated signals may be employed to implement an equalizer (EQ) estimator 905 circuit or program.

Figure 10:
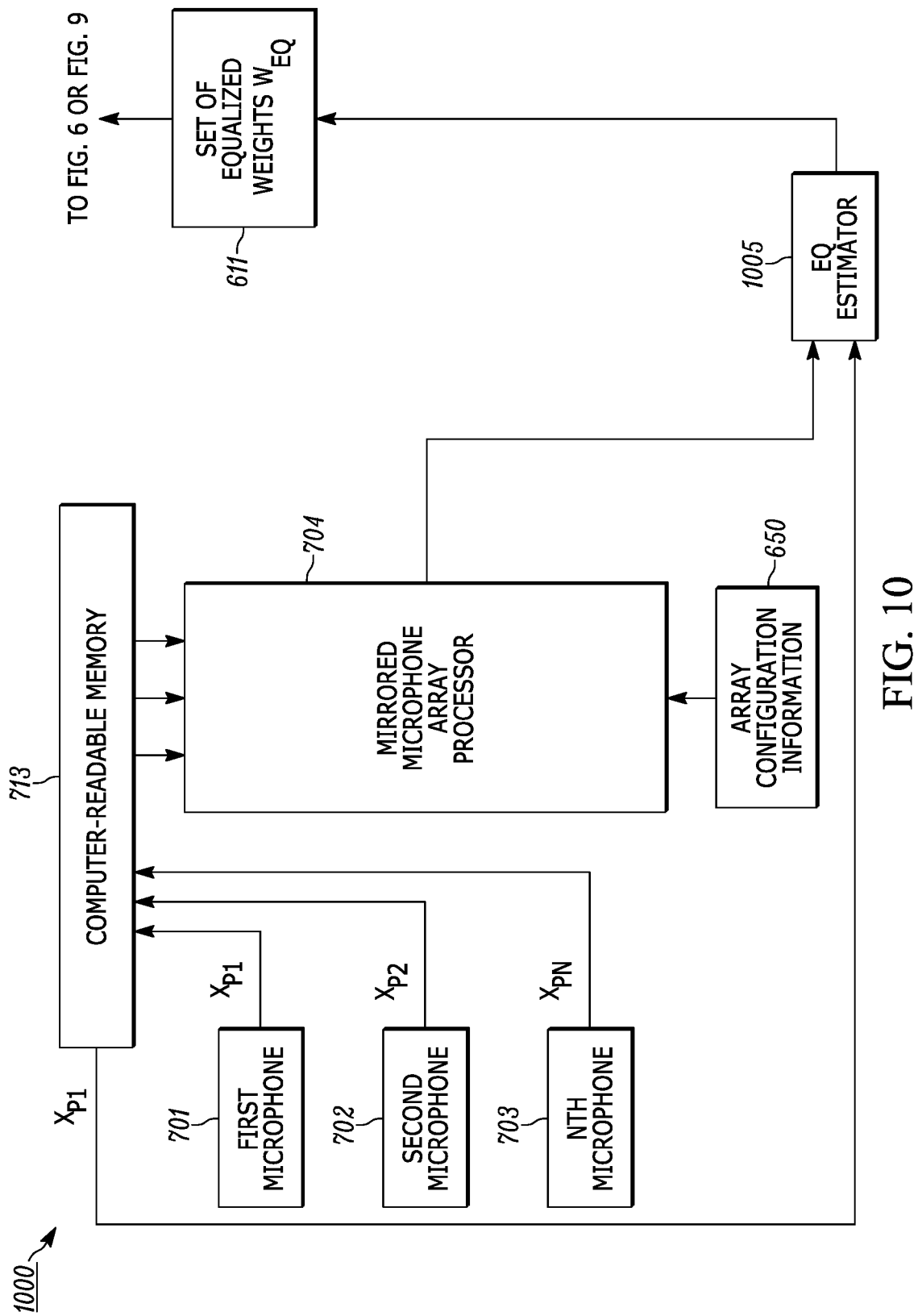
FIG. 10 is a hardware block diagram of a third illustrative mirrored adaptive microphone array constructed in accordance with another set of exemplary embodiments.

FIG. 10 is a hardware block diagram illustrating a third mirrored adaptive microphone array 1000 constructed in accordance with another set of exemplary embodiments. It may be recognized that common blocks and elements can be used to construct the configuration of FIG. 10. To facilitate understanding, identical reference numerals have been used in FIGS. 7 and 10, wherever possible, to designate identical elements that are common to these figures. It should be understood that the mirrored adaptive microphone array 1000 of FIG. 10 may be employed in conjunction with any of the real-time adaptive microphone arrays shown in FIGS. 6 and 9. Moreover, it should be understood that any of the real-time adaptive microphone arrays of FIGS. 6 and 9 may be implemented using the same set of physical elements or programming functions as any of the mirrored adaptive microphone arrays of FIGS. 7, 8, and 10.

The mirrored adaptive microphone array 1000 of FIG. 10 acts on inputs from the first, second, and Nth microphones 701, 702, and 703. The outputs of the first, second, and Nth microphones 701, 702, and 703 (FIG. 10) are stored in the computer-readable memory 713. A mirrored microphone array processor 704 (FIG. 10) accepts the array configuration information 650 from any of the real-time adaptive microphone arrays of FIG. 6 or 9. The mirrored adaptive microphone array processor 704 (FIG. 10) retrieves the stored outputs of the first, second, and Nth microphones 701, 702, and 703 from the computer-readable memory 713 and applies the retrieved outputs to a first input of an equalizer estimator 1005 circuit or program. A second input of the equalizer estimator 1005 accepts an output from one or more of the microphones which, for purposes of illustration, may but need not be the first microphone 701. The EQ estimator 1005 generates the set of equalizer weights $W_{EQ}$ 611 (FIG. 10) for any of the configurations of FIG. 6 or 9.

Figure 11:
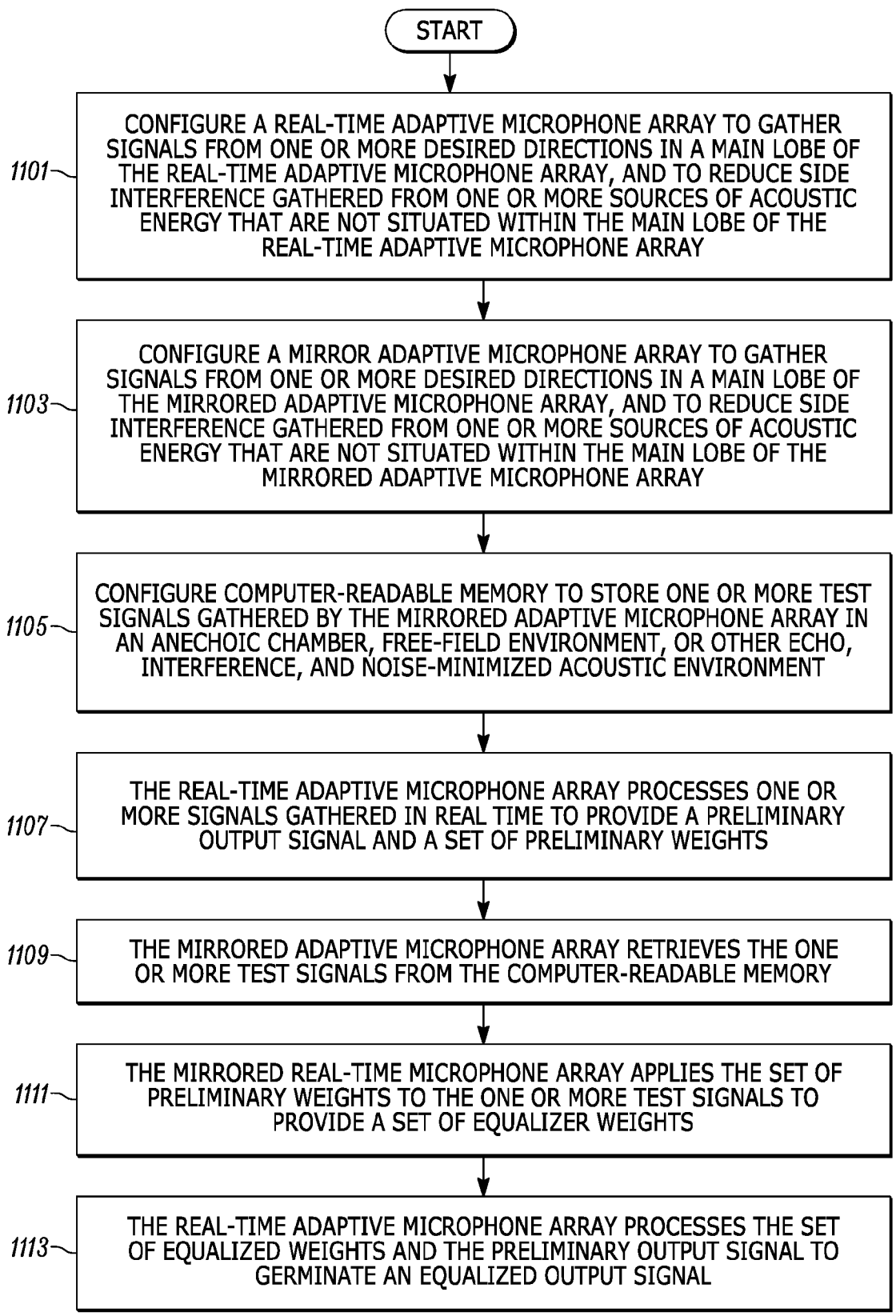
FIG. 11 is a flowchart showing an illustrative operational sequence for performing adaptive equalization of a microphone array in accordance with a set of exemplary embodiments.

FIG. 11 is a flowchart showing an illustrative operational sequence for performing adaptive equalization of a microphone in accordance with a set of exemplary embodiments. The operational sequence of FIG. 11 commences at block 1101 where a real-time adaptive microphone array 600 (FIG. 7) is configured to gather signals from one or more desired directions in a main lobe of the array, and is also configured to reduce side interference gathered from one or more sources of acoustic energy that are not situated within the main lobe of the array. Likewise, at block 1103 (FIG. 11), a mirrored adaptive microphone array 700 (FIG. 7) is configured to gather one or more test signals. The operational sequence of FIG. 11 progresses to block 1105 where a computer-readable memory 713 (FIG. 7) is configured to store one or more test signals gathered by the mirrored adaptive microphone array 700 in an anechoic chamber, free-field environment, or other echo, interference and noise-minimized acoustic environment. Blocks 1103 and 1105 (FIG. 11) are generally performed once, during an initial setup/tuning phase.

Next, at block 1107, the real-time adaptive microphone array 600 (FIG. 6) processes a plurality of signals gathered in real time to provide the preliminary output signal $X_E$ 609 and the set of preliminary weights 608. At block 1109 (FIG. 11), the mirrored adaptive microphone array 700 (FIG. 7) retrieves the one or more test signals from the computer-readable memory 713. The operational sequence of FIG. 11 advances to block 1111 where the mirrored adaptive microphone array 700 (FIG. 7) applies the set of preliminary weights 708 to the one or more test signals to provide a set of equalizer weights 711. Next, at block 1113 (FIG. 11), the real-time adaptive microphone array processes the set of equalizer weights 711 and the preliminary output signal $X_E$ 609 to generate an equalizer output signal that minimizes any degradation observed in the gathered signals from the main lobe resulting from the reducing of side interference.

The operational sequence of FIG. 11 can be applied regardless of whether the direction of interest is in front of the real-time adaptive microphone array 600 (FIG. 6), or at some known angle with respect to the array 600. If the equalizer weights are to be derived for a signal situated at some angle with respect to the array 600, then it may be desirable to obtain and store one or more test signals at that angle. Pursuant to a further set of embodiments, an adaptive microphone system is provided where an angle between a desired source and the array 600 can be varied, and test signals are stored in the computer-readable memory 713 (FIG. 7) for each of a plurality of angles.

The procedure of FIG. 11 can also be used to derive a solution which results in a linear phase response for the entire adaptive microphone system comprising the real-time adaptive microphone array 600 of FIG. 6 and the mirrored adaptive microphone array 700 of FIG. 7. A linear phase response may be accomplished by calculating equalizer weights that provide a desired phase response, based on the one or more test signals, and the output of the mirrored adaptive microphone array 700 in response to these one or more test signals.

The aforementioned operational sequence of FIG. 11 is merely an example that is intended to be encompassed by the present disclosure. The present disclosure is intended to encompass numerous other manners of operation in addition to those specifically described previously. Numerous other examples of operation in accordance with the processes of FIG. 11, or variations of these processes, can be envisioned and are encompassed herein.

Figure 12:
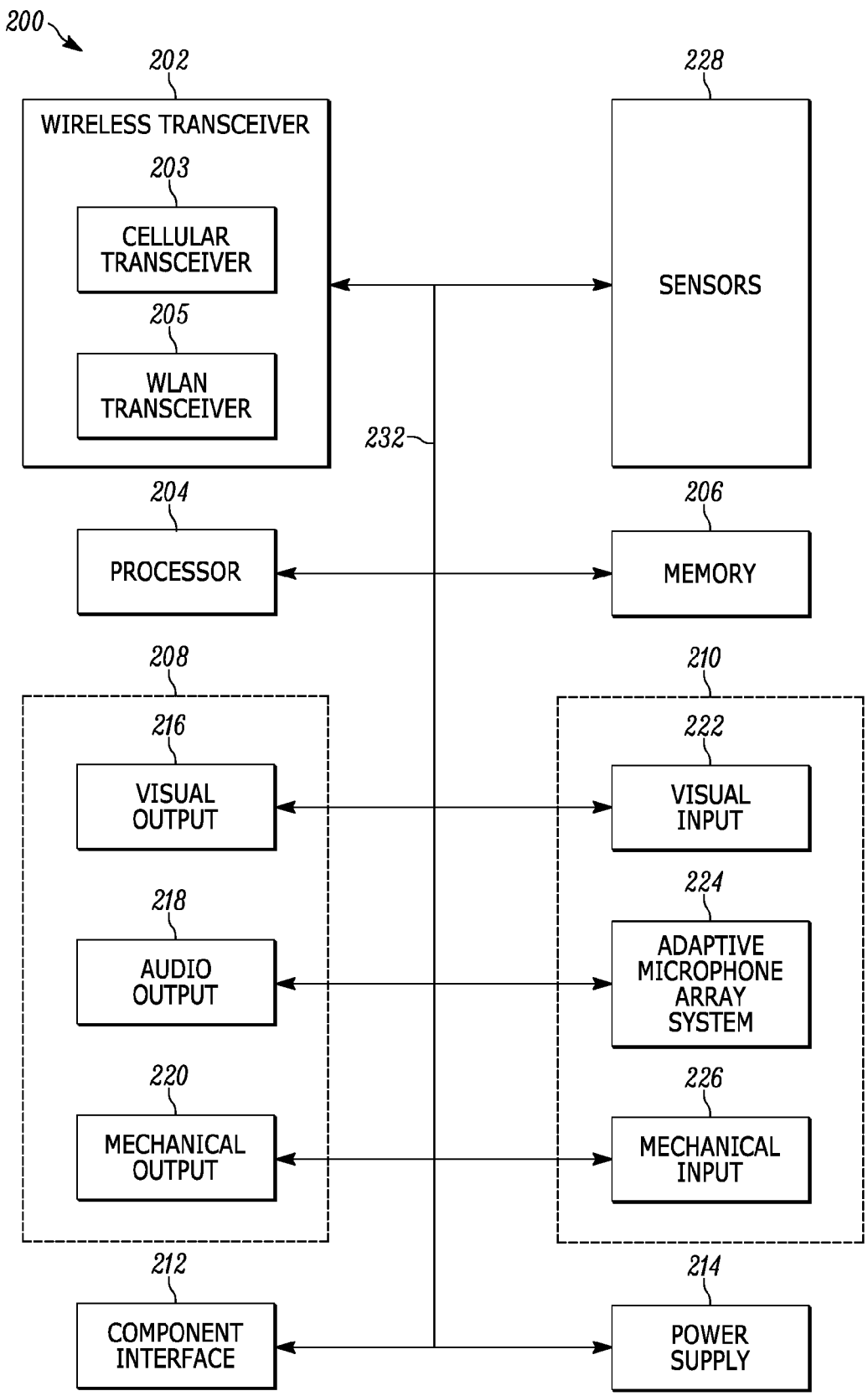
FIG. 12 is a hardware block diagram showing an illustrative mobile device for performing adaptive equalization of a microphone array in accordance with a set of exemplary embodiments.

FIG. 12 is a hardware block diagram showing an illustrative mobile device 200 for performing adaptive microphone equalization in accordance with a set of exemplary embodiments. The mobile device 200 is representative of any communication device that is operated by persons (or users) or possibly by other entities (e.g., other computers) desiring or requiring communication capabilities, or automated speech recognition capabilities. In some embodiments, for example, the mobile device 200 may be any of a smartphone, a cellular telephone, a personal digital assistants (PDA), another type of handheld or portable electronic device, a headset, an MP3 player, a battery-powered device, a wearable device, a wristwatch, a radio, a navigation device, a laptop or notebook computer, a netbook, a pager, a PMP (personal media player), a DVR (digital video recorder), a gaming device, a game interface, a camera, an e-reader, an e-book, a tablet device, a navigation device with a video-capable screen, a multimedia docking stations, or another type of electronic mobile device.

As shown in FIG. 12, an illustrative mobile device 200 includes one or more wireless transceivers 202, a processor 204 (e.g., a microprocessor, microcomputer, application-specific integrated circuit, etc.), a memory 206, one or more output devices 208, and one or more input devices 210. In at least some embodiments, a user interface is present that comprises one or more output devices 208, such as a display, and one or more input devices 210, such as a keypad or touch sensor. The mobile device 200 can further include a component interface 212 to provide a direct connection to auxiliary components or accessories for additional or enhanced functionality. The mobile device 200 preferably also includes a power supply 214, such as a battery, for providing power to the other internal components while enabling the mobile device to be portable. Some or all of the components of the mobile device 200 can be coupled to one another, and in communication with one another, by way of one or more internal communication links 232 (e.g., an internal bus).

In the present embodiment of FIG. 12, the wireless transceivers 202 particularly include a cellular transceiver 203 and a wireless local area network (WLAN) transceiver 205. More particularly, the cellular transceiver 203 is configured to conduct cellular communications, such as 3G, 4G, 4G-LTE, etc., vis-à-vis cell towers (not shown), albeit in other embodiments, the cellular transceiver 203 can be configured instead or additionally to utilize any of a variety of other cellular-based communication technologies such as analog communications (using AMPS), digital communications (using CDMA, TDMA, GSM, iDEN, GPRS, EDGE, etc.), and/or next generation communications (using UMTS, WCDMA, LTE, IEEE 802.16, etc.) or variants thereof.

The WLAN transceiver 205 may, but need not, be configured to conduct Wi-Fi communications in accordance with the IEEE 802.11 (a, b, g, or n) standard with access points. In other embodiments, the WLAN transceiver 205 can instead (or in addition) conduct other types of communications commonly understood as being encompassed within Wi-Fi communications such as some types of peer-to-peer (e.g., Wi-Fi Peer-to-Peer) communications. Further, in other embodiments, the WLAN transceiver 205 can be replaced or supplemented with one or more other wireless transceivers configured for non-cellular wireless communications including, for example, wireless transceivers employing ad hoc communication technologies such as HomeRF (radio frequency), Home Node B (3G femtocell), Bluetooth and/or other wireless communication technologies such as infrared technology. Thus, although in the present embodiment the mobile device 108 has two of the wireless transceivers 203 and 205, the present disclosure is intended to encompass numerous embodiments in which any arbitrary number of (e.g., more than two) wireless transceivers employing any arbitrary number of (e.g., two or more) communication technologies are present.

Exemplary operation of the wireless transceivers 202 in conjunction with others of the internal components of the mobile device 200 can take a variety of forms and can include, for example, operation in which, upon reception of wireless signals, the internal components detect communication signals and one or more of the wireless transceivers 202 demodulate the communication signals to recover incoming information, such as voice and/or data, transmitted by the wireless signals. After receiving the incoming information from one or more of the wireless transceivers 202, the processor 204 formats the incoming information for the one or more output devices 208. Likewise, for transmission of wireless signals, the processor 204 formats outgoing information, which may or may not be activated by the input devices 210, and conveys the outgoing information to one or more of the wireless transceivers 202 for modulation to communication signals. The wireless transceivers 202 convey the modulated signals by way of wireless and (possibly wired as well) communication links to other devices such as a server and possibly one or more content provider websites (as well as possibly to other devices such as a cell tower, access point, or another server or any of a variety of remote devices).

Depending upon the embodiment, the mobile device 200 may be equipped with one or more input devices 210, or one or more output devices 208, or any of various combinations of input devices 210 and output devices 208. The input and output devices 208, 210 can include a variety of visual, audio and/or mechanical outputs. For example, the output device(s) 208 can include one or more visual output devices 216 such as a liquid crystal display and light emitting diode indicator, one or more audio output devices 218 such as a speaker, alarm and/or buzzer, and/or one or more mechanical output devices 220 such as a vibrating mechanism. The visual output devices 216 can include, among other things, a video screen.

The input devices 210 (FIG. 12) include one or more audio input devices such as an adaptive microphone array system 224. Alternatively or additionally, the one or more audio input devices may comprise accessory devices. The adaptive microphone array system 224 includes the real-time adaptive microphone array 600 of FIG. 6 and the mirrored real-time adaptive microphone array 700 of FIG. 7. In practice, note that the same set of physical devices may, but need not, be used to implement both the real-time adaptive microphone array 600 (FIG. 6) and the mirrored adaptive microphone array 700 (FIG. 7). Alternatively or additionally, the mirrored adaptive microphone array 700 may be provided remotely or as part of a remote system. For example, a remote database of test signals may be provided, and/or the mirrored adaptive microphone array 700 may be at a remote location, but the results of the mirrored adaptive microphone array (i.e., the EQ filter) is applied to the real-time adaptive microphone array 600 (FIG. 6) in real time.

Likewise, by example, the input devices 210 (FIG. 12) may, but need not, include one or more sensors 228, or one or more mechanical input devices 226 such as a flip sensor, keyboard, keypad, selection button, navigation cluster, touch pad, touchscreen, capacitive sensor, motion sensor, or switch. Actions that can actuate one or more of the input devices 210 can include not only the physical pressing/actuation of buttons or other actuators, but can also include, for example, opening the mobile device (if it can take on open or closed positions), unlocking the device, moving the device to actuate a motion, moving the device to actuate a location positioning system, and operating the device.

The mobile device 200 may also include one or more of various types of sensors 228. The sensors 228 can include, for example, proximity sensors (a light detecting sensor, an ultrasound transceiver or an infrared transceiver), touch sensors, altitude sensors, a location circuit that can include, for example, a Global Positioning System (GPS) receiver, a triangulation receiver, an accelerometer, a tilt sensor, a gyroscope, or any other information collecting device that can identify a current location or user-device interface (carry mode) of the mobile device 200. Although the sensors 228 are for the purposes of FIG. 12 considered to be distinct from the input devices 210, in other embodiments it is possible that one or more of the input devices can also be considered to constitute one or more of the sensors (and vice-versa). Additionally, even though in the present embodiment the input devices 210 are shown to be distinct from the output devices 208, it should be recognized that in some embodiments one or more devices serve both as input device(s) and output device(s). For example, in embodiments where a touchscreen is employed, the touchscreen can be considered to constitute both a visual output device and a mechanical input device.

The memory 206 of the mobile device 200 can encompass one or more memory devices of any of a variety of forms (e.g., read-only memory, random access memory, static random access memory, dynamic random access memory, etc.), and can be used by the processor 204 to store and retrieve data. In some embodiments, the memory 206 can be integrated with the processor 204 in a single device (e.g., a processing device including memory or processor-in-memory (PIM)), albeit such a single device will still typically have distinct portions/sections that perform the different processing and memory functions and that can be considered separate devices.

The data that is stored by the memory 206 can include, but need not be limited to, operating systems, applications, and informational data, such as a database. Each operating system includes executable code that controls basic functions of the communication device, such as interaction among the various components included among the mobile device 200, communication with external devices via the wireless transceivers 202 and/or the component interface 212, and storage and retrieval of applications and data, to and from the memory 206. In addition, the memory 206 can include one or more applications for execution by the processor 204. Each application can include executable code that utilizes an operating system to provide more specific functionality for the communication devices, such as file system service and the handling of protected and unprotected data stored in the memory 206. Informational data is non-executable code or information that can be referenced and/or manipulated by an operating system or application for performing functions of the communication device. One such application is a client application which is stored in the memory 206 and configured for performing the methods described herein. The memory 206 may, but need not, be used to implement the computer-readable memory 713 shown in FIG. 7.

The client application is intended to be representative of any of a variety of client applications that can perform the same or similar functions on any of various types of mobile devices, such as mobile phones, tablets, laptops, etc. The client application is a software-based application that operates on the processor 204 and is configured to provide an interface between one or more input devices 210, or one or more output devices 208, or any of various combinations thereof. In addition, the client application governs operation of one or more of the input and output devices 210, 208. Further, the client application may be configured to work in conjunction with a visual interface, such as a display screen, that allows a user of the mobile device 200 to initiate various actions. The client application can take any of numerous forms and, depending on the embodiment, be configured to operate on, and communicate with, various operating systems and devices. It is to be understood that various processes described herein as performed by the mobile device 200 can be performed in accordance with operation of the client application in particular, and/or other application(s), depending on the embodiment.

It should be recognized that the previously described configurations of FIGS. 1-10 and 12, as well as the procedures of FIG. 11, are applicable to solving the general problem of correcting a degraded target signal in applications that utilize multi-sensor spatial processing. Such configurations and procedures have application in areas other than microphone arrays, and include hydro-acoustics/sonar, radio, smart antennas, radar and others. In these cases, naturally, the appropriate test signals and environments will be used to collect the information needed for the operation of the respective mirrored systems.

Many adaptive array systems may rely on additional supporting mechanisms which are helpful or essential to the optimal operation of the array. One such mechanism is voice activity detection (VAD). VAD is often necessary for the adaptive array in order to detect presence of desired talker activity and slow-down, or even freeze adaptation. This is done in order to minimize audible artifacts introduced in the desired talker's speech by the FIR filter(s) continuously changing weights. Another detail is placement of delays in the signal path, where appropriate, to among other reasons ensure causality of the adaptive system. Other details include the size of FIR filters (when the FIR mechanism is used).

Some of the embodiments presented herein describe use of FIR filters in the adaptive system, which is disclosed for illustrative purposes only. As an alternative or addition to FIR filters, adaptation using recursive filters, or adaptation in the frequency domain, could be used. Forming the constituent elements of the microphone arrays 600, 700 of FIGS. 6 and 7 can also be performed using any combination of time delay (including fractional), time domain FIR or IIR, as well as frequency domain filtering and processing. The choice of one approach versus the other is based on factors such as: available code base, other processing already done in the system, computational costs, current drain costs, development costs and time schedules, and other considerations.

It should be appreciated that one or more embodiment encompassed by the present disclosure are advantageous in one or more respects. Thus, it is specifically intended that the present disclosure not be limited to the embodiments and illustrations contained herein, but include modified forms of those embodiments including portions of the embodiments and combinations of elements of different embodiments as come within the scope of the following claims.

What is claimed is:

1. A method comprising:
    configuring a real-time adaptive microphone array to gather signals from one or more desired directions in a main lobe of the array;
    configuring the array to reduce side interference gathered from one or more sources of acoustic energy that are not situated within the main lobe of the array;
    configuring a computer-readable memory to store one or more test signals;
    processing one or more signals gathered in real time to provide a preliminary output signal and a set of preliminary weights;
    retrieving the one or more test signals from the computer-readable memory;
    modeling a degradation in the gathered signals from the adaptive microphone array by applying the set of preliminary weights to the one or more test signals to provide a set of equalizer weights; and
    minimizing or reducing the modeled degradation in the gathered signals by processing the set of equalizer weights and the preliminary output signal to generate an equalized output signal.

2. The method of claim 1 further comprising gathering the one or more test signals in a test environment comprising an anechoic chamber, a free-field environment, or another echo, interference and noise-minimized acoustic environment.

3. The method of claim 2 further comprising obtaining the one or more test signals using a source of white noise, a source of pink noise, a test signal having a spectral content similar or identical to that of a desired target signal, a multi-tone signal, a pseudospeech signal, or any of various combinations thereof.

4. The method of claim 1 further comprising collecting an initial set of signals for the one or more test signals using a mirrored adaptive microphone array.

5. The method of claim 4 further comprising selecting a first set of microphones for the real-time adaptive microphone array and selecting a second set of microphones for the mirrored adaptive microphone array.

6. The method of claim 5 wherein the second set of microphones comprises a representative set provided by one representative device.

7. The method of claim 1 further comprising using a single reference test microphone for collecting an initial set of signals for the one or more test signals.

8. An apparatus comprising:
    a real-time adaptive microphone array configured to gather signals from one or more desired directions in a main lobe of the array, and configured to reduce side interference gathered from one or more sources of acoustic energy that are not situated within the main lobe of the array; and
    a computer-readable memory, operatively coupled to the array, and configured to store one or more test signals gathered by the array;
    wherein the real-time adaptive microphone array further comprises a processing mechanism for:
        processing one or more signals gathered in real time to provide a preliminary output signal and a set of preliminary weights;
        retrieving the one or more test signals from the computer-readable memory;
        modeling a degradation in the gathered signals from the adaptive microphone array by applying the set of preliminary weights to the one or more test signals to provide a set of equalizer weights; and
        minimizing or reducing the modeled degradation in the gathered signals by processing the set of equalizer weights and the preliminary output signal to generate an equalized output signal.

9. The apparatus of claim 8 wherein the stored one or more test signals are obtained from a test environment comprising an anechoic chamber, a free-field environment, or another echo, interference and noise-minimized acoustic environment.

10. The apparatus of claim 9 wherein the stored one or more test signals are obtained using a source of white noise, a source of pink noise, a test signal having a spectral content similar or identical to that of a desired target signal, a multi-tone signal, a pseudospeech signal, or any of various combinations thereof.

11. The apparatus of claim 8 further comprising a mirrored adaptive microphone array, configured for being operatively coupled to the computer-readable memory, for collecting an initial set of signals for the one or more test signals.

12. The apparatus of claim 11 wherein the real-time adaptive microphone array comprises a first set of microphones and the mirrored adaptive microphone array comprises a second set of microphones.

13. The apparatus of claim 12 wherein the second set of microphones comprises a representative set provided by one representative device.

14. The apparatus of claim 8 further comprising a single reference test microphone for collecting an initial set of signals for the one or more test signals.

15. A non-transitory computer-readable memory encoded with a computer program comprising computer readable instructions recorded thereon for execution of a method that includes:
   configuring a real-time adaptive microphone array to gather signals from one or more desired directions in a main lobe of the array;
   configuring the array to reduce side interference gathered from one or more sources of acoustic energy that are not situated within the main lobe of the array;
   configuring a computer-readable memory to store one or more test signals;
   processing one or more signals gathered in real time to provide a preliminary output signal and a set of preliminary weights;
   retrieving the one or more test signals from the computer-readable memory;
   modeling a degradation in the gathered signals from the adaptive microphone array by applying the set of preliminary weights to the one or more test signals to provide a set of equalizer weights; and
   minimizing or reducing the modeled degradation in the gathered signals by processing the set of equalizer weights and the preliminary output signal to generate an equalized output signal.

16. The non-transitory computer-readable memory of claim 15 further comprising instructions for gathering the one or more test signals in a test environment comprising an anechoic chamber, a free-field environment, or another echo, interference and noise-minimized acoustic environment.

17. The non-transitory computer-readable memory of claim 16 further comprising instructions for obtaining the one or more test signals using a source of white noise, a source of pink noise, a test signal having a spectral content similar or identical to that of a desired target signal, a multi-tone signal, a pseudospeech signal, or any of various combinations thereof.

18. The non-transitory computer-readable memory of claim 15 further comprising instructions for using a mirrored adaptive microphone array to collect an initial set of signals for the one or more test signals.

19. The non-transitory computer-readable memory of claim 18 further comprising instructions for selecting a first set of microphones for the real-time adaptive microphone array, and for selecting a second set of microphones for the mirrored adaptive microphone array.

20. The non-transitory computer-readable memory of claim 19 further comprising instructions for selecting one representative device for implementing the second set of microphones.

* * * * *